United States Patent
Lee

(10) Patent No.: US 12,236,553 B2
(45) Date of Patent: Feb. 25, 2025

(54) METHODS AND SYSTEMS FOR PROCESSING IMAGES TO PERFORM AUTOMATIC ALIGNMENT OF ELECTRONIC IMAGES

(71) Applicant: Bluebeam, Inc., Pasadena, CA (US)

(72) Inventor: Jae Min Lee, Fullerton, CA (US)

(73) Assignee: Bluebeam, Inc., Pasadena, CA (US)

( * ) Notice: Subject to any disclaimer, the term of this patent is extended or adjusted under 35 U.S.C. 154(b) by 0 days.

(21) Appl. No.: 18/413,803

(22) Filed: Jan. 16, 2024

(65) Prior Publication Data

US 2024/0153030 A1    May 9, 2024

Related U.S. Application Data

(63) Continuation of application No. 17/979,144, filed on Nov. 2, 2022, now Pat. No. 11,908,099, which is a
(Continued)

(51) Int. Cl.
| | |
|---|---|
| *G06K 7/14* | (2006.01) |
| *G06F 30/12* | (2020.01) |
| *G06K 19/06* | (2006.01) |
| *G06T 3/053* | (2024.01) |
| *G06T 3/08* | (2024.01) |

(Continued)

(52) U.S. Cl.
CPC ............. *G06T 3/053* (2024.01); *G06F 30/12* (2020.01); *G06K 7/1417* (2013.01); *G06K 19/06028* (2013.01); *G06T 3/08* (2024.01); *G06T 3/10* (2024.01); *G06T 17/00* (2013.01)

(58) Field of Classification Search
None
See application file for complete search history.

(56) References Cited

U.S. PATENT DOCUMENTS

| | | |
|---|---|---|
| 5,832,110 A | 11/1998 | Hull |
| 2008/0295035 A1 | 11/2008 | Mattila et al. |

(Continued)

OTHER PUBLICATIONS

Xie et al. "Deep3D: Fully automatic 2D-to-3D video conversion with deep convolutional neural networks." In: European Conference on Computer Vision. Apr. 13, 2016 Retrieved on Aug. 15, 2020 from entire document (15 pages).

(Continued)

*Primary Examiner* — Joni Hsu
(74) *Attorney, Agent, or Firm* — Bookoff McAndrews, PLLC

(57) ABSTRACT

Systems and methods are disclosed for aligning a two-dimensional (2D) design image to a 2D projection image of a three-dimensional (3D) design model. One method comprises receiving a 2D design document, the 2D design document comprising a 2D design image, and receiving a 3D design file comprising a 3D design model, the 3D design model comprising one or more design elements. The method further comprises generating a 2D projection image based on the 3D design model, the 2D projection image comprising a representation of at least a portion of the one or more design elements, generating a projection barcode based on the 2D projection image, and generating a drawing barcode based on the 2D design image. The method further comprises aligning the 2D projection image and the 2D design image by comparing the projection barcode and the drawing barcode.

19 Claims, 13 Drawing Sheets

Related U.S. Application Data continuation of application No. 16/893,478, filed on Jun. 5, 2020, now Pat. No. 11,521,295.

(60) Provisional application No. 62/858,155, filed on Jun. 6, 2019.

(51) Int. Cl.
  *G06T 3/10* (2024.01)
  *G06T 17/00* (2006.01)

(56) References Cited

U.S. PATENT DOCUMENTS

| | | |
|---|---|---|
| 2009/0001165 A1 | 1/2009 | Zhang et al. |
| 2011/0221846 A1 | 9/2011 | Smith |
| 2012/0055991 A1 | 3/2012 | Nakamura |
| 2013/0218531 A1 | 8/2013 | Deichmann et al. |
| 2015/0351477 A1 | 12/2015 | Stahl et al. |
| 2017/0091281 A1 | 3/2017 | Tizhoosh |
| 2018/0053347 A1 | 2/2018 | Fathi |
| 2019/0108673 A1 | 4/2019 | Nakamura et al. |
| 2021/0068750 A1 | 3/2021 | Stone |
| 2021/0192099 A1 | 6/2021 | Benromano |
| 2021/0312696 A1 | 10/2021 | Liu |

OTHER PUBLICATIONS

Extended European Search Report issued in European Patent Application No. 20818665.0 on Jun. 14, 2023 (9 pages).

Rofer T Ed—Institute of Electrical and Electronics Engineers: "Using histogram correlation to create consistent laser scan maps", Proceedings of the 2002 IEEE/RSJ International Conference on Intelligent Robots and Systems., US, vol. 1 Sep. 30, 2002, pp. 625-630 (6 pages).

Trzeciak Maciej: "Towards Registration of Construction Drawings to Building Information Models", 30. Forum Bauinformatik, Sep. 19, 2018, pp. 1-7. Retrieved from the Internet: https://publications.cms.bgu.tum.de/2018_TowardsRegistration_FBI.pdf. (7 pages).

METHODS AND SYSTEMS FOR PROCESSING IMAGES TO PERFORM AUTOMATIC ALIGNMENT OF ELECTRONIC IMAGES

CROSS-REFERENCE TO RELATED APPLICATION(S)

This patent application is a continuation of U.S. application Ser. No. 17/979,144, filed on Nov. 2, 2022, which is a continuation of U.S. application Ser. No. 16/893,478, filed on Jun. 5, 2020, which has issued as U.S. Pat. No. 11,521,295 B2, which claims the benefit of priority to U.S. Provisional Patent Application No. 62/858,155, filed on Jun. 6, 2019, the entireties of which are incorporated herein by reference.

TECHNICAL FIELD

The present disclosure relates to systems and methods for automatically aligning electronic images. More particularly, the present disclosure relates to systems and methods for automatically aligning building information models (BIM) and electronic drawings.

BACKGROUND

Building information model (BIM) files contain a rich data set comprising a three-dimensional (3D) geometry of design elements (e.g., building objects), as well as specific details of the design elements. Even though the BIM holistically represents a comprehensive data set, two-dimensional (2D) design images or drawings, both electronic and printed, are extensively used both onsite and offsite in the AEC (architecture, engineering, and construction) industry.

The background description provided herein is for the purpose of generally presenting the context of the disclosure. Unless otherwise indicated herein, the materials described in this section are not prior art to the claims in this application and are not admitted to be prior art, or suggestions of the prior art, by inclusion in this section.

SUMMARY OF THE DISCLOSURE

One embodiment provides a computer-implemented method for aligning a two-dimensional (2D) design image to a 2D projection image of a three-dimensional (3D) design model, comprising: receiving a 2D design document, the 2D design document comprising a 2D design image, and receiving a 3D design file comprising a 3D design model, the 3D design model comprising one or more design elements. The method further comprises generating a 2D projection image based on the 3D design model, the 2D projection image comprising a representation of at least a portion of the one or more design elements, generating a projection barcode based on the 2D projection image, and generating a drawing barcode based on the 2D design image. The method further comprises aligning the 2D projection image and the 2D design image by comparing the projection barcode and the drawing barcode.

One embodiment provides a system for aligning a two-dimensional (2D) design image to a 2D projection image of a three-dimensional (3D) design model. The system may comprise one or more processors; and a non-transitory computer readable medium storing instructions which, when executed by the one or more processors, cause the one or more processors to perform a method comprising: receiving a 2D design document, the 2D design document comprising a 2D design image, and receiving a 3D design file comprising a 3D design model, the 3D design model comprising one or more design elements. The method further comprises generating a 2D projection image based on the 3D design model, the 2D projection image comprising a representation of at least a portion of the one or more design elements, generating a projection barcode based on the 2D projection image, and generating a drawing barcode based on the 2D design image. The method further comprises aligning the 2D projection image and the 2D design image by comparing the projection barcode and the drawing barcode.

One embodiment provides a non-transitory computer readable medium for aligning a two-dimensional (2D) design image to a 2D projection image of a three-dimensional (3D) design model. The non-transitory computer readable medium may store instructions that, when executed by one or more processors, cause the one or more processors to perform a method comprising: receiving a 2D design document, the 2D design document comprising a 2D design image, and receiving a 3D design file comprising a 3D design model, the 3D design model comprising one or more design elements. The method further comprises generating a 2D projection image based on the 3D design model, the 2D projection image comprising a representation of at least a portion of the one or more design elements, generating a projection barcode based on the 2D projection image, and generating a drawing barcode based on the 2D design image. The method further comprises aligning the 2D projection image and the 2D design image by comparing the projection barcode and the drawing barcode.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
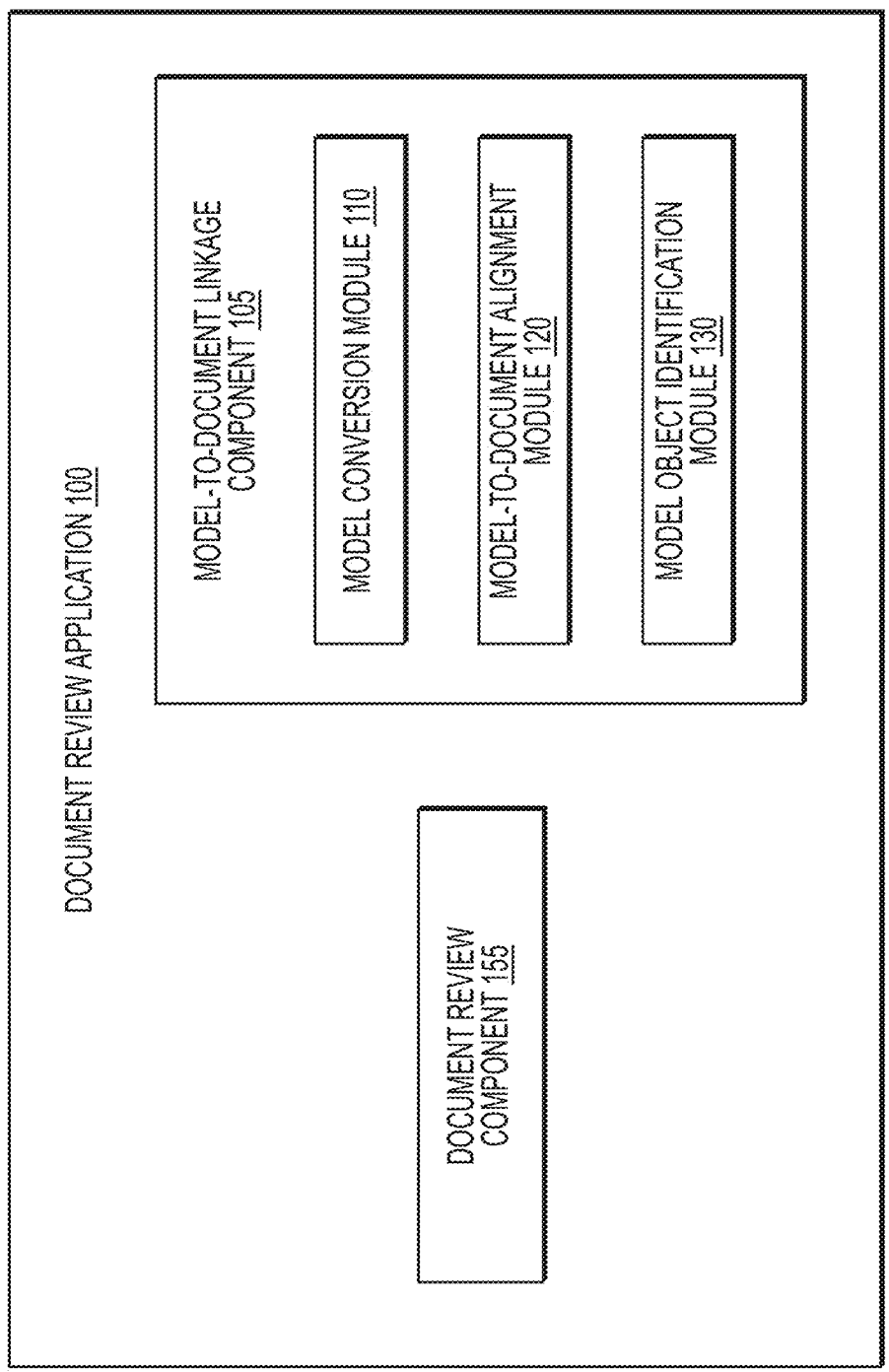
FIG. 1 shows a block diagram of an exemplary document review application, according to at least one aspect of the present disclosure.

The following embodiments describe methods and systems for object identification in a design file and, more particularly, for aligning a two-dimensional (2D) design image to a 2D projection image of a three-dimensional (3D) design model.

Building information model (BIM) files contain a rich data set comprising 3D geometry of design elements (e.g., building objects) as well as specific details of the design elements. The details, or the properties of a design element, may include dimensions for a specific shape, physical values for materials, operating characteristics of the elements (such as flow ratings on HVAC equipment), relations to other design elements, building objects, time-related values for task scheduling, and so forth. The properties may represent all required data during a life cycle of the design project, from design, engineering, and construction to facility management and operations.

Even though the BIM represents a comprehensive data set, the most prevalent form of information source in the AEC (architecture, engineering, and construction) industry both onsite and offsite may be a two-dimensional (2D) design image or drawing, due to its ability to concisely represent design information based on project-specific discipline needs. Domain-specific symbols and annotations may provide additional information for workers to understand the design from specific viewpoints. Nonetheless, the current disconnect between the BIM and the 2D design drawing creates a significant inefficiency when attempting to cross-reference between these two disparate information sources. For instance, during design reviews, certain issues detected in the drawings often require additional, more detailed information to better understand and/or resolve the detected issues. Currently, referencing from a 2D design drawing to a BIM can be accomplished via manual reference techniques.

Therefore, there is a need for an improved method of cross-referencing between a 3D design model and a 2D design document. Further, there is a need for an ability to automatically align representations of 3D design models and 2D design documents. This automatic alignment may act as a step to transfer and relate data in BIM and drawing representations of a ultimately what will be the physical building.

The disclosed embodiments may facilitate a more convenient design review process by enabling BIM data to be directly included in 2D drawing representations. The disclosed embodiments are directed to establishing a linkage between a 3D design file and a 2D design document, by using a color-coded 2D design image projected from a 3D design model contained in the 3D design file. Briefly, in one embodiment, a 3D design model of a 3D design file may be projected onto a 2D space, creating a 2D representation of the 3D design model. Then, a color or other indicator may be assigned to each design element in the 2D representation, forming a coded 2D design image, such as a color-coded 2D design image. While color coding will be frequently be discussed herein, any indicators may be used with techniques presented herein. For example, patterns, shapes, tags, alphanumeric or other characters, tooltips, symbols, etc., may be used as indicators. The value representing the color of each design element in the color-coded 2D design image, such as an RGB value, may be stored in the 3D design file as the unique identifier for that design element. Subsequently, when a user selects a point in a 2D design image of a 2D design document, the point will be mapped to a reference point in the color-coded 2D design image. The color value, or other indicator value, of the design element over which the reference point lies in the color-coded 2D design image may be used to find a matching unique identifier in the 3D design file. Once the matching unique identifier is found, detailed information stored in the 3D design file in association with the matching unique identifier (i.e., detailed information on the design element) may be retrieved and displayed with the 2D design image. While the color-coded 2D design image may be referred to as such herein, it needn't be color-coded, and various embodiments may utilize any image that is a representation or projection of the 3D design model. Accordingly, the color-coded 2D design image may be alternatively referred to herein as the 2D projection image, the 2D representation, etc.

In other embodiments, the 2D representation of a 3D design file may be represented as, or used to generate, a one or two-dimensional barcode, and may be associated with a one or two dimensional barcode generated based on a 2D design image. By comparing the barcodes, the 2D representation of the 3D design file and the 2D design image may be associated with each other. This may allow for automatic alignment, rotation, resizing, or other simultaneous manipulations of both the 2D representation and the 2D design image.

The subject matter of the present disclosure will now be described more fully hereinafter with reference to the accompanying drawings, which form a part hereof, and which show, by way of illustration, specific exemplary embodiments. An embodiment or implementation described herein as "exemplary" is not to be construed as preferred or advantageous, for example, over other embodiments or implementations; rather, it is intended to reflect or indicate that the embodiment(s) is/are "example" embodiment(s). Subject matter may be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof. The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of exemplary embodiments in whole or in part.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section.

Referring now to the appended drawings, FIG. 1 shows a block diagram of an exemplary document review application, according to one aspect of the present disclosure. The document review application 100 may be installed on a computing device consistent with or similar to that depicted in FIG. 6. In general, the document review application 100 may comprise a document review component 155 and a model-to-document linkage component 105.

The document review component 155 may enable a user to locate a 2D or 3D design document from a local or remote storage, open and make modifications to the design document (e.g., add, remove, or modify drawings, annotations, markups, etc.), save the modified design document in a local or remote storage, delete the design document, collaborate with other users synchronously or asynchronously to review/edit the design document, etc. In one embodiment, the document review component 155 may be a PDF document reviewing/editing software component. However, in other embodiments, the document review component 155 may be a document reviewing/editing software component also compatible with other types of files such as, e.g., BIM files, word processing documents, CAD drawings, etc. The documents reviewed using the document review component 155 may include, but may not be limited to, architectural drawings, engineering drawings, and construction drawings (i.e., documents frequently used in the AEC industry).

The model-to-document linkage component 105 may establish a linkage between a 2D design document and a 3D design file, such that a user may be able to retrieve relevant information stored in the 3D design file while interacting with the 2D design document. The 3D design file may be a BIM file, or any data file that includes a 3D design model, the 3D design model comprising design elements (e.g., walls, column, stairways, doors, windows, etc.) and information relevant to the design elements. The design elements in the 3D design model may thus be 3D design elements. In the 3D design file, the information relevant to each design element may be stored as a design element data set. The 2D design document may comprise an electronic document that includes 2D images of design elements. The 2D design document may also comprise supplemental information, such as annotations added by a user. The 2D design document may be, for example, a PDF document, which may be reviewed and edited via the document review component 155. In one embodiment, the information contained in the 3D design file may be more comprehensive and extensive compared to the information contained in the 2D design document. However, in some cases, the information contained in the 3D design file may not be more comprehensive or extensive compared to the information contained in the 2D design document.

Figure 2A:
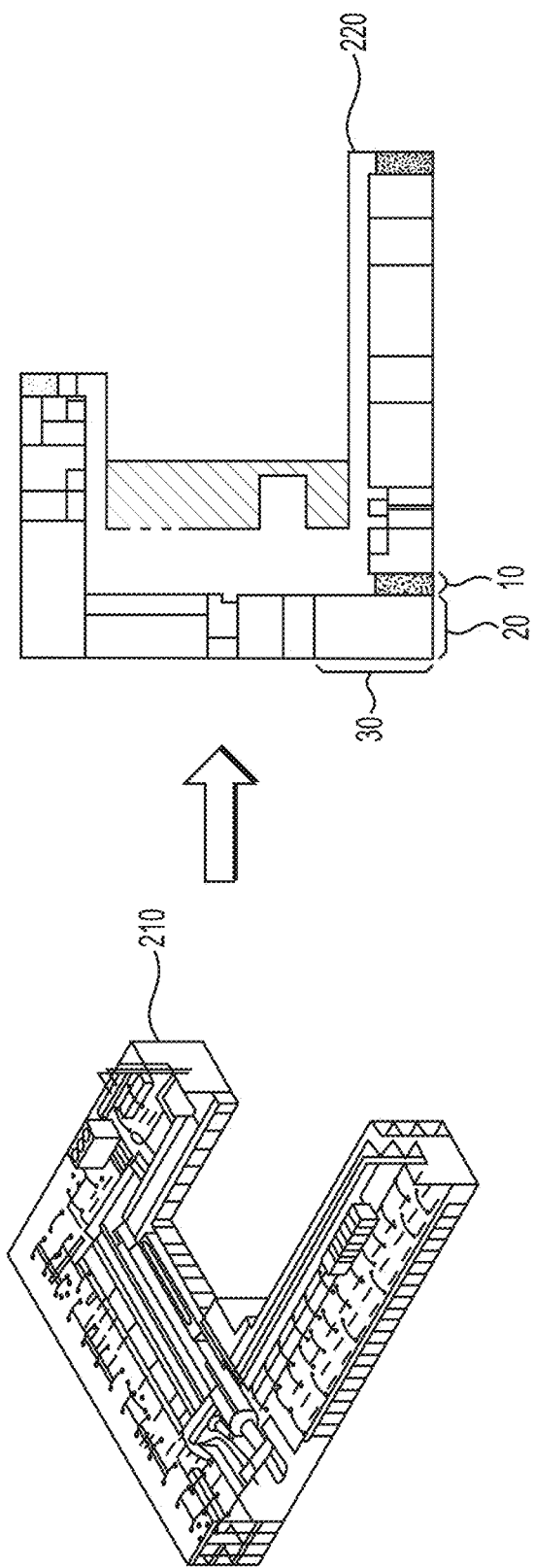
FIGS. 2A-2C illustrate the functions performed by various modules of an exemplary model-to-document linkage component, according to at least one aspect of the present disclosure.
Figure 2B:
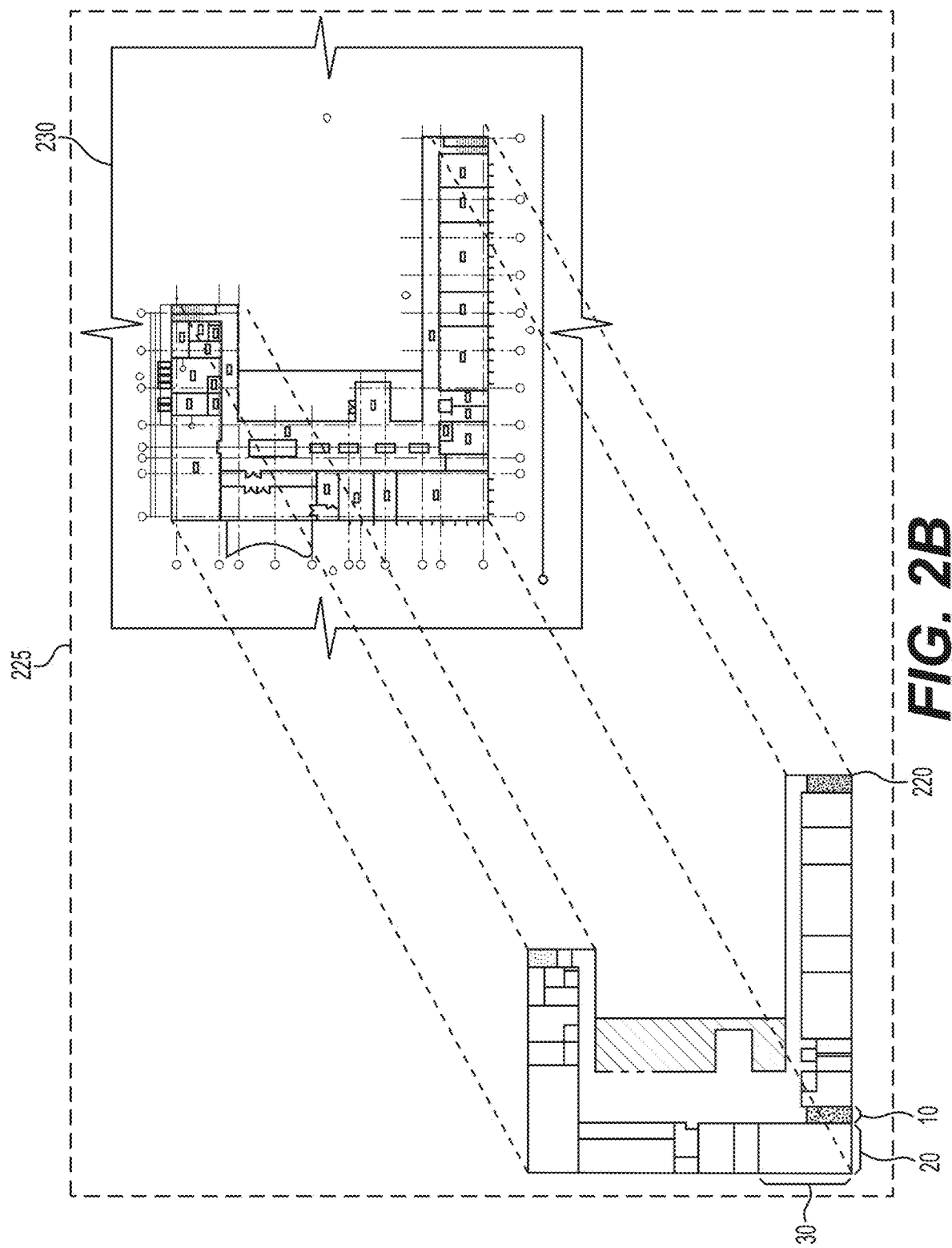
Figure 2C:
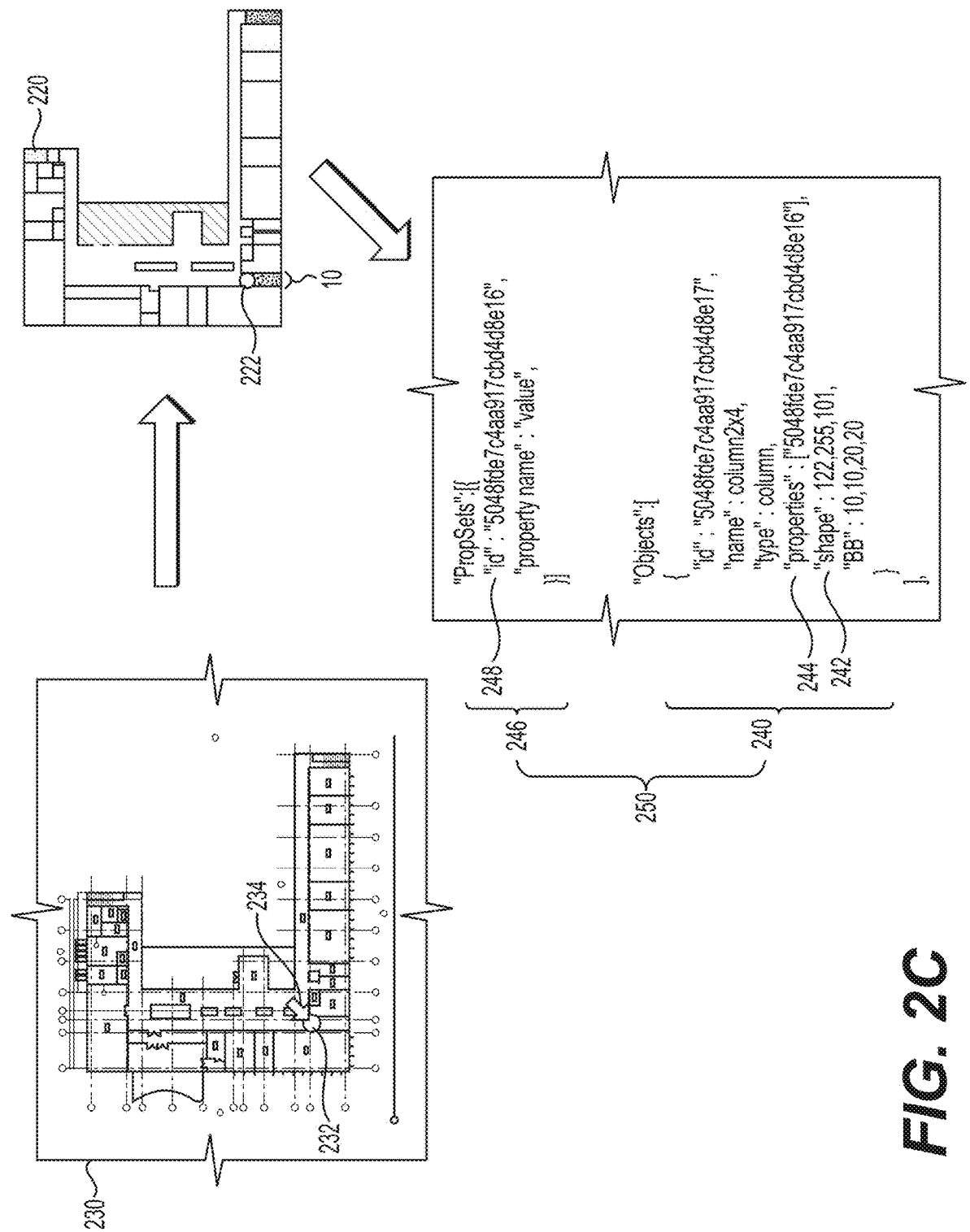

More specifically, the model-to-document linkage component 105 may comprise a model conversion module 110, a model-to-document alignment module 120, and a model object identification module 130. FIGS. 2A-2C illustrate the functions performed by the model conversion module 110, model-to-document alignment module 120, and/or model object identification module 130, according to one aspect of the present disclosure. In the discussion below, references will be made to both FIG. 1 and FIGS. 2A-2C.

While techniques discussed herein may refer to various steps being performed by different modules, such as the model conversion module 110, the model-to-document alignment module 120, and the model object identification module 130, such steps may be performed by any module or software component discussed herein, on one or multiple computers, may be performed by one or across multiple devices, and/or within a single or across multiple software applications.

The model conversion module 110 may convert a 3D design model in the 3D design file to a color-coded 2D design image 220, as shown in FIG. 2A, in order to assign unique identifiers to the design elements in the 3D design model. The 3D design file and the 3D design model 210 contained therein may be retrieved from a local or remote storage (e.g., automatically or based on user selection), or may be received from a user via the computer's input/output (I/O) interface. While the 3D design model 210 may be converted to a color-coded 2D design image 220, the original 3D design model 210 may be retained for further usage and data gathering. The color-coded 2D design image 220 may be generated by projecting the 3D design model 210 onto a 2D space to create a 2D design image, which is a 2D visual representation of the 3D design model 210, and assigning a color to each design element in the 2D design image. As alluded to above, a design element may be a line, a set of lines, a geometrical shape, or a polygon that represents an object within a design image, such as a wall, column, stairway, door, toilet, sink, window, etc. The assigned color may be represented as an RGB value, and the RGB value may be used as a unique identifier for the design element to which the color is assigned. The colored design elements in the 2D design image may be referred to as color-coded 2D design elements (e.g., color-coded 2D design elements 10, 20, and 30) throughout the disclosure. The 2D design image that comprises the color-coded 2D design elements may thus be referred to as the color-coded 2D design image 220, as alluded to above.

The color-coded 2D design image 220 shown in FIG. 2A may comprise a plurality of color-coded 2D design elements (e.g., color-coded 2D design elements 10, 20, and 30), although FIG. 2A is shown in black and white. For example, the color-coded 2D design element 10 may represent a column or pillar in a building, and may take the form of a rectangle filled with green color. The color-coded 2D design element 20, the straight line between the color-coded design elements 10 and 30, may represent a wall in the building, and may be colored blue. The color-coded 2D design element 30 may represent a window in the building, and may be a straight line colored yellow. Although only the color-coded 2D design elements 10, 20, and 30 are specifically described, it should be recognized that, as shown in FIG. 2A, the color-coded 2D design image 220 may comprise other color-coded 2D design elements, each representing a particular design element with a distinct color, shape, pattern, and/or size. Notably, the color or other indicator of a particular design element may uniquely identify that design element.

The unique identifier (i.e., the RGB value) generated from each color-coded 2D design element may be stored in association with the corresponding design element in the 3D design file (e.g., a BIM file). An example of a unique identifier stored in the 3D design file is depicted in FIG. 2C. For example, the unique identifier 242 shown in FIG. 2C comprises an RGB value of "122, 255, 101" stored in association with the design element "column2x4." Such a unique identifier may be generated for each design element in the color-coded 2D design image 220 and may be stored in association with the corresponding design element in the 3D design file. For instance, the unique identifier may be stored in the design element data set 250, which stores information relevant to the corresponding design element.

With renewed reference to FIG. 1, the model-to-document alignment module 120 may align a 2D design image 230 with a color-coded 2D design image 220, as shown in FIG. 2B. As will be explained in greater detail in the following sections, aligning the 2D design image 230 with the color-coded 2D design image 220 may enable the model object identification module 130 to determine a point in the color-coded 2D design image 220 that corresponds to a user-selected point in the 2D design image 230. A 2D design document (e.g., a PDF document) containing the 2D design image 230 may be retrieved from a local or remote storage (e.g., automatically or based on user selection), or directly from the user via the computer's I/O interface.

In one embodiment, to align the 2D design image 230 with the color-coded 2D design image 220, the model-to-document alignment module 120 may generate a barcode-type representation of each of the 2D design image 230 and the color-coded 2D design image 220, as will be discussed further below.

With renewed reference to FIG. 1, the model object identification module 130 may identify a design element (or the design element data set 250 storing the information relevant to the design element) in the 3D design file in response to a user selection of a point in the 2D design image 230. The identification of the design element in the 3D design file may enable display of additional and/or more detailed information pertaining to the design element. More particularly, as shown in FIG. 2C, a user viewing the 2D design image 230 may select a point 232 in the 2D design image 230, using a pointer or cursor 234 via a graphical user interface(GUI). The user may select the point 232 in order to view more detailed information about the design element upon which the point 232 is placed. In other words, the user may select a certain design element by placing a pointer or cursor 234 over the design element. The model object identification module 130 may then determine a reference point 222 in the color-coded 2D design image 220 that corresponds to the user-selected point in the 2D design image 230. As alluded to above, the determination of the reference point 222 may be based on the alignment of the 2D design image 230 and the color-coded 2D design image 220 previously performed by the model-to-document alignment module 120 (i.e., based on the stored alignment data 225).

In an alternative or additional embodiment, the user may select a region in the 2D design image 230. For instance, the user may draw a circle, a polygon, or any geometric shape enclosing a desired region within the 2D design image 230. The model object identification module 130 may then determine a reference region in the color-coded 2D design image 220 that corresponds to the user-selected region in the 2D design image 230. The determination of the reference region may be based on the alignment of the 2D design image 230 and the color-coded 2D design image 220 (i.e., based on the stored alignment data 225).

The model object identification module 130 may then determine a design element (or the design element data set 250 storing the information relevant to the design element) in the 3D design file that corresponds to the reference point 222. The corresponding design element in the 3D design file may be determined by determining an RGB value of the color-coded 2D design element 10 that lines up with the reference point 222 (i.e., that is beneath the reference point 222), using the RGB value, or other indicator value, to identify a matching unique identifier 242 in the 3D design file, and identifying the design element data set 250 as the data set pertaining to the design element selected by the user.

It should be noted that, in the event that the user selects a region instead of a point in the 2D design image 230, which leads to formation of a corresponding reference region in the color-coded 2D design image 220, the model object identification module 130 may determine one or more design elements (or one or more design element data sets storing information relevant to the one or more design elements) in the 3D design file that correspond to the reference region. In other words, the reference region may enclose an area that corresponds to more than one design element.

The identification of the design element data set 250 may involve two steps, each step being directed to identifying a subset of the design element data set 250. The design element data set 250 associated with a design element may comprise a design element identification data set 240 and a design element property data set 246. The design element identification data set 240 may comprise various types of information that, individually or in combination, uniquely identifies the associated design element. For example, the design element identification data set 240 may comprise, among other things, a property identifier 244 and/or a unique identifier 242 associated with the design element. The design element property data set 246 may comprise properties and corresponding property values associated with the design element. Various properties of a design element may comprise shape properties such as width, height, length, perimeter, min and max plate thickness, and cross section area, physical values of material such as weight, mass-density, and porosity, relations to other design elements such as spatial containment, aggregation, and connection, and time related values such as cost schedule and work schedule, etc. The design element property data set 246 may also comprise a property identifier 248 that may match with the property identifier 244 stored in the design element identification data set 240, such that one of the data sets 246 or 240 may be located by using a property identifier stored in the other data set.

Upon determining the RGB value of the color-coded 2D design element 10 corresponding to the reference point 222, the model object identification module 130 may locate the unique identifier 242 in the 3D design file that matches the RGB or other indicator value. For the purposes of describing the model object identification step, it will be assumed that the RGB value pertaining to the reference point 222 is "122, 255, 101." Using this RGB value, the matching unique identifier 242 (which was previously generated and stored in the 3D design file by the model conversion module 110) may be located within the design element identification data set 240. The model object identification module 130 may then use the property identifier 244 stored in the design element identification data set 240 to locate the corresponding design element property data set 246 that contains the matching property identifier 248. Once the design element identification data set 240 and the design element property data set 246 are identified (i.e., once the design element data set 250 is identified), the model object identification module 130 may retrieve information associated with the design element from one or more of the identified data sets, and may display the retrieved information with the 2D design image 230.

Figure 3:
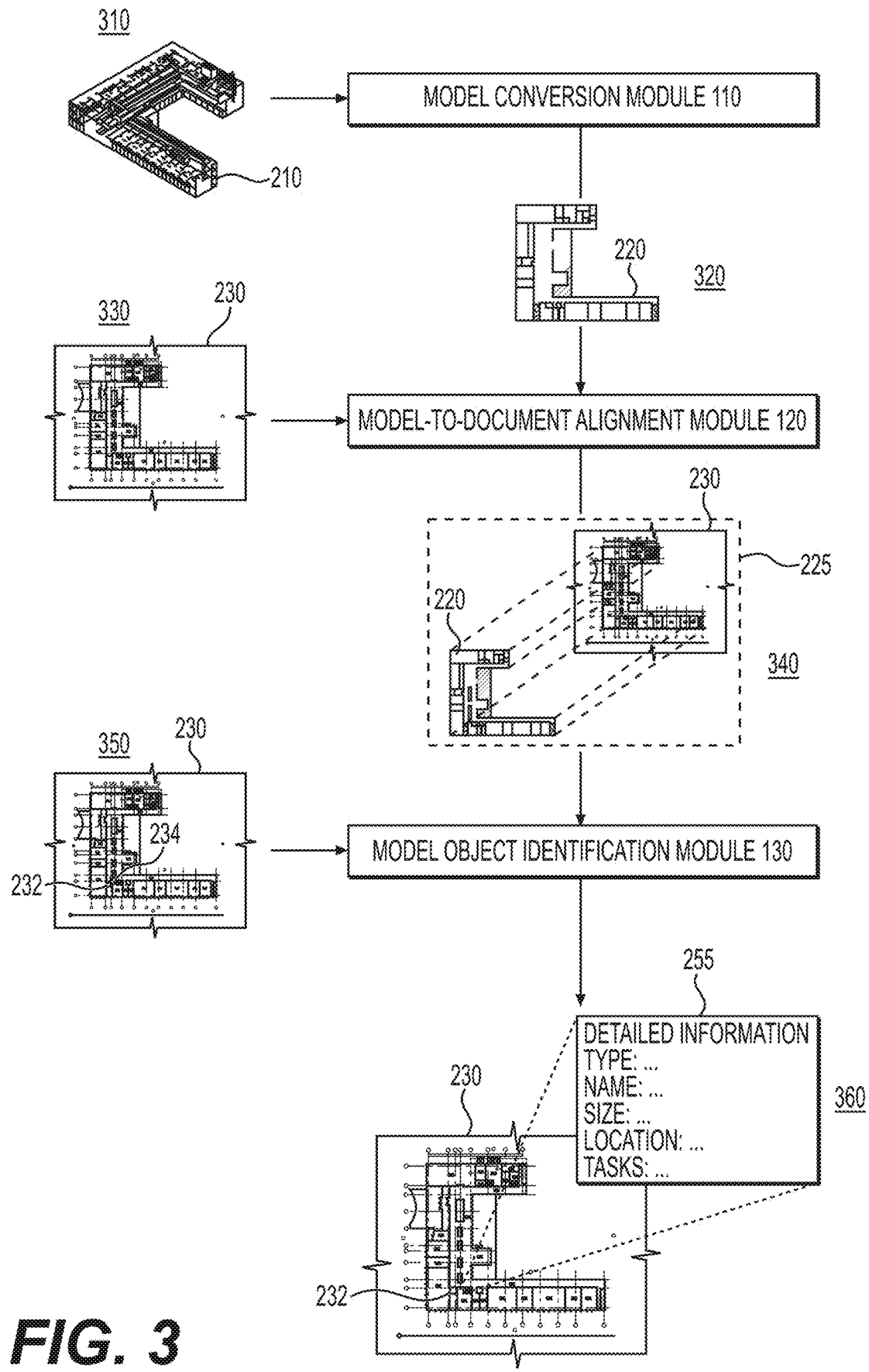
FIG. 3 illustrates a flow of data being input to and output from the various modules of the exemplary model-to-document linkage component, according to at least one aspect of the present disclosure.

FIG. 3 illustrates a flow of data being input to and output from individual modules 110, 120, 130 of an exemplary model-to-document linkage component 105, according to one aspect of the present disclosure. Notably, FIG. 3 illustrates a data flow during the process of identifying a design element in a 3D design file based on a user-selected point in a 2D design image. At step 310, a 3D design model 210 may be input to the model conversion module 110. As alluded to above, a 3D design file containing the 3D design model 210 may be received from a user or retrieved from a local and/or remote storage. The model conversion module 110 may generate a color-coded 2D design image 220 based on the received 3D design model 210. At step 320, the color-coded 2D design image 220 may be input to the model-to-document alignment module 120. At step 330, a 2D design document containing a 2D design image 230 may also be input to the model-to-document alignment module 120. As alluded to above, the 2D design document containing the 2D design image 230 may be received from a user or retrieved from a local and/or remote storage automatically or based on user selection. Steps 320 and 330 may take place simultaneously or one after another. The model-to-document alignment module 120 may align the 2D design image 230 with the color-coded 2D design image 220, and store data representing the alignment (i.e., alignment data 225) in a local and/or remote storage, as described above. At step 340, the alignment data 225 may be input to the model object identification module 130. At step 350, user selection of a point 232 in the 2D design image 230 (e.g., using the pointer or cursor 234, touching a touchpad, etc.) may be input to the model object identification module 130. Steps 340 and 350 may take place simultaneously or one after another. The model object identification module 130 may then determine a reference point 222 in the color-coded 2D design image 220 based on the alignment data 225 and may determine a design element data set 250 that contains information relevant to the design element corresponding to the reference point 222 (which corresponds to the user-selected point 232). At step 360, the model object identification module 130 may retrieve and output the information to a graphical user interface (GUI) of the document review application 100, the information being displayed in a detailed information window 255, in connection with the design element corresponding to the point 232.

Figure 4:
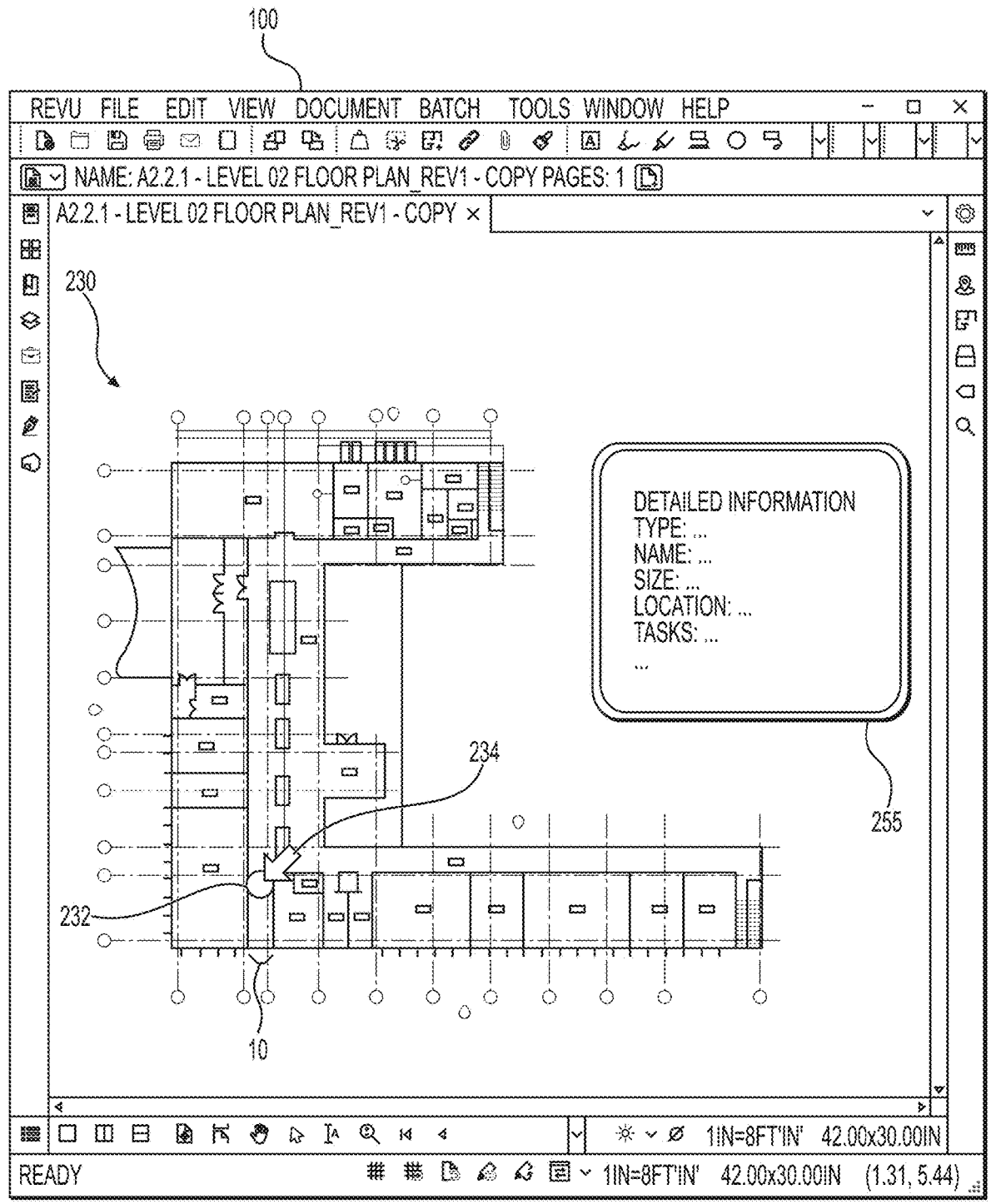
FIG. 4 depicts an exemplary graphical user interface (GUI) of the exemplary document review application with a model-to-document linkage feature enabled, according to at least one aspect of the present disclosure.

FIG. 4 depicts an exemplary graphical user interface (GUI) of a document review application 100 with a model-to-document linkage feature enabled, according to one aspect of the present disclosure. As alluded to above, the document review application 100 enables a user of a computing device to view, create, manipulate, print, and/or manage 2D design documents. Typically, the document review application 100 may display a 2D design image 230 of the 2D design document, along with a limited set of supplemental information associated with the 2D design image 230. For example, the document review application 100 may display annotations and/or symbols added by the user in relation to a particular design element or a region within the displayed 2D design image. However, with the implementation of the model-to-document linkage feature of the current disclosure, the document review application 100 may also be capable of retrieving detailed information pertaining to a user-selected design element in the displayed 2D design image 230, the detailed information being retrieved from a 3D design file.

For example, as illustrated in FIG. 4, the document review application 100 may enable the user to select a design element in the displayed 2D design image 230 by placing a pointer or cursor 234 over the desired design element. Upon the pointer or cursor 234 being placed over a desired design document, the document review application 100 display detailed information pertaining to the selected design element in a detailed information window 255. However, the information retrieved from the 3D design file may be displayed in various ways. For example, the document review application 100 may include a detailed information pane at the top, right side, left side, or bottom of the application window, and display the detailed information in the detailed information pane. As another example, the display of the detailed information may necessitate the user clicking or tapping on the desired design element (e.g., by a mouse or by a finger if the computing device has a touchscreen), not merely hovering over the design element. In some embodiments, the detailed information may be transmitted to another user via email, text message, chat message, application-to-application message transmission, etc. In some embodiments, the document review application 100 may be configured to hold a collaborative session where multiple users may collaboratively view, manipulate, and/or comment on the 2D design document 230 synchronously or asynchronously. During such a collaborative session, the document review application 100 may display/broadcast a user's movement of the pointer or cursor 234 in the document review application 100, selection of the point 232 (i.e., a design element), and the detailed information window 255 to other participants of the collaborative session who may also be using their respective copies of the document review application 100.

Figure 5:
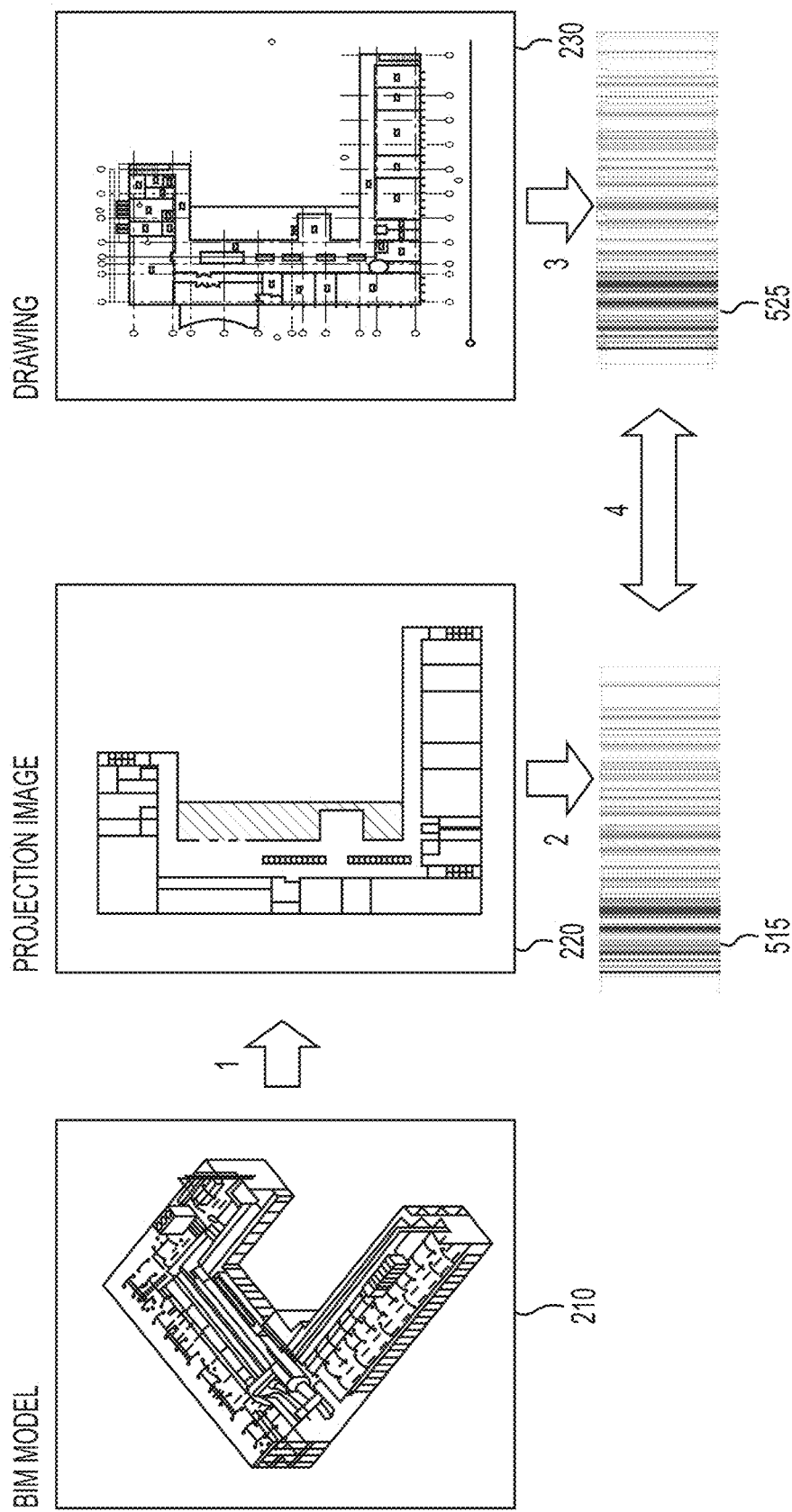
FIG. 5 illustrates an exemplary process of generating barcodes from images and drawings, according to techniques presented herein.

Details of various techniques of aligning the 2D projection image 220 and the 2D design image 230 will now be discussed. FIG. 5 illustrates an exemplary process of generating barcode-type representations from images and drawings. For the sake of brevity, the barcode-type representation will be referred to as a barcode throughout the disclosure. The barcode image may act as an index of the features of the drawing and may aide in uniquely identify (or "fingerprinting") the drawing. Automatic alignment may be done between two barcode images, for example between a BIM-generated projection image and a corresponding drawing.

Referring to FIG. 5, at step 1, the 3D design model 210 may be projected into two dimensions to form a 2D projection image 220, which may be a plan view. As discussed elsewhere herein, the 2D projection image 220 may be color-coded, and may alternatively be referred to as the color-coded 2D design image 220. At step 2, a projection barcode 515 may be generated based on the 2D projection image 220. At step 3, drawing barcode 525 may be generated based on 2D design image 230, where the 2D design image 230 may be a drawing. At step 4, the projection barcode 515 and the drawing barcode 525 may be compared and aligned. Based on this comparison, the 2D projection image 220 and the 2D design image 230 may be aligned. While steps 1-4 are discussed in a certain order, these steps do not necessarily need to be performed in this order.

Figure 6:
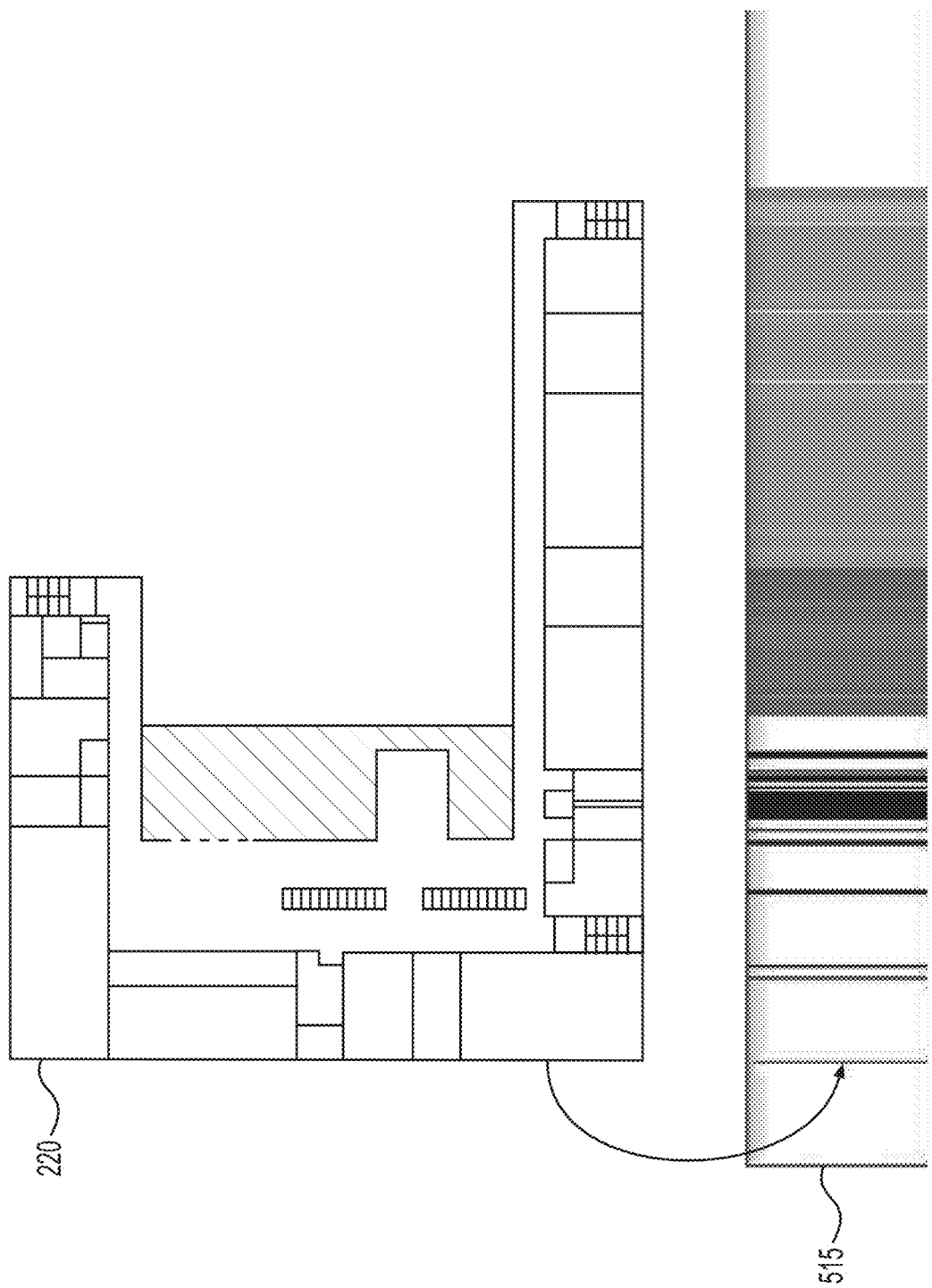
FIG. 6 depicts an exemplary process for generating a barcode from an image, according to techniques presented herein.

FIG. 6 depicts an exemplary process for generating a barcode from an image, according to techniques presented herein. While 2D projection image 220 and projection barcode 515 are shown in FIG. 6, any barcode may be generated for any drawing using the following techniques. A barcode may be generated, for example, by scanning vertical lines (columns) from the leftmost column to the rightmost column of an image. The number of pixels in each vertical line may be counted, and the pixel count may be normalized in each vertical line based on a 256 scale, or, for example, some other power of two. The normalized pixel count may be used for each barcode line (i.e., barcode line value) in the barcode. While the barcodes illustrated herein are two-dimensional "linear" barcodes in black and white, the barcodes may be one-dimensional, or may have three or more dimensions. Additionally, barcodes may be generated in any color schema.

Alternatively, each barcode line may be determined by averaging the pixel value of each vertical column of the image. Further, each barcode line may be determined as a median pixel value or modal pixel value of the pixels in each vertical column of the image.

Figure 7:
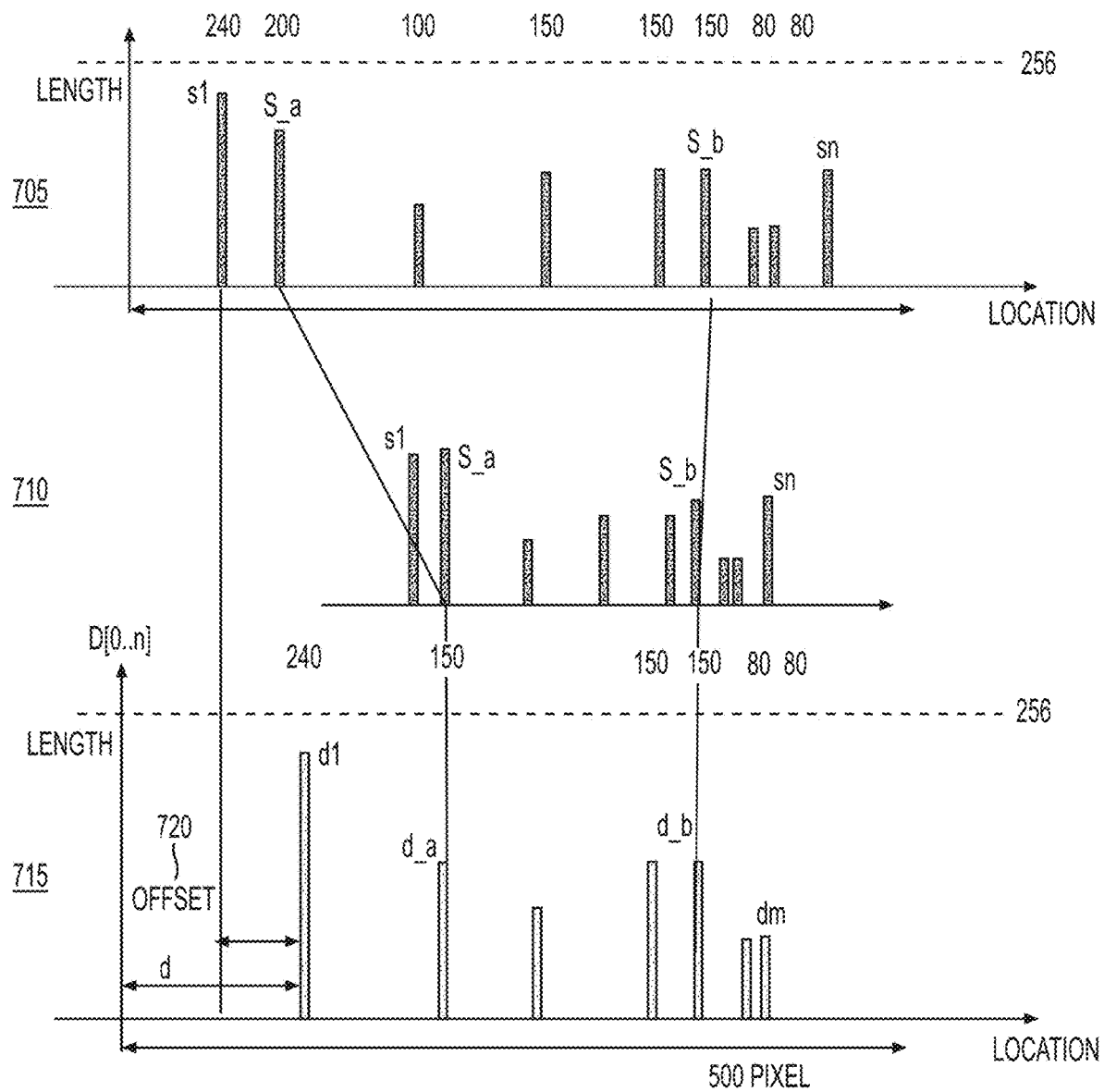
FIG. 7 illustrates an exemplary method for aligning two barcodes, according to techniques presented herein.

Once the barcodes of both the 2D design image 230 and the 2D projection image 220 have been determined, the two barcodes may be aligned. FIG. 7 illustrates an exemplary method for aligning two barcodes, according to techniques presented herein. Two barcodes may be aligned by comparing the barcode line values and determining a matching pattern in the change of the barcode line values across the barcodes.

For example, barcode 705, which may be called "B1", is a set of bars s1 to sn while barcode 715, which may be called "B2" is a set of bars d1 to dm. Thus, it may be said that:

$$B1=\{s1, \ldots s\_a \ldots, s\_b \ldots sn\}, B2=\{d1, \ldots d\_a \ldots, d\_b \ldots dm\}$$

Suppose, for example, that bars s_a and s_b (order(s_a)<order(s_b)) are elements of barcode B1, and bars d_a, d_b (order(d_a)<order(d_b)) are elements of barcode B2. If s_a is aligned to d_a and s_b is aligned to d_b, this alignment may be denoted as alignment1={s_a, s_b, d_a, d_b}. The data representing the alignment (i.e., alignment data 225) may be stored in a local and/or remote storage for subsequent uses. A matching value may be defined as the sum of the multiplication of corresponding bar values in B1 and B2 in the same column after the alignment. For example, column 1 of B1 is multiplied by column 1 of B2, column 2 of B1 is multiplied by column 2 of B2, etc., and then the products are all added together. Thus, it may be said that matching value, mv(s_a, s_b, d_a, d_b)=sum (bar in B1×bar in B2) only if the column of (bar in B1) and the column of (bar in B2) is the same. The matching may be performed by finding the alignment {s_a, s_b, d_a, d_b} where the value of my is maximal.

An offset 720 may also be determined, which may correspond to the horizontal distance between a bar from the first barcode and the corresponding bar from the second barcode, this distance being determined when the two barcodes are associated with, or aligned along, the same x-axis/horizontal axis. The offset may be determined prior to the barcodes being scaled or otherwise adjusted.

Figure 8:
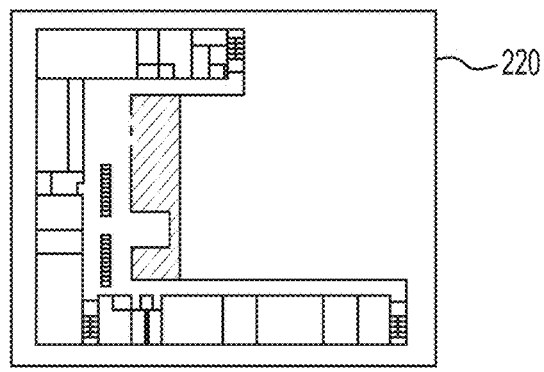
FIG. 8 illustrates an exemplary method for aligning two barcodes, according to techniques presented herein.
Figure 8:
Figure 8:
Figure 8:
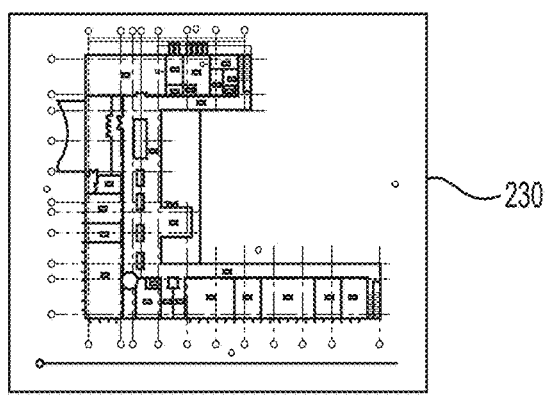

FIG. 8 illustrates an exemplary method for aligning two barcodes, according to techniques presented herein. The 2D projection image 220 may be aligned with 2D design image 230 by first determining associated barcodes 515 and 525, using techniques discussed elsewhere herein. The matching values may be determined for a variety of possible alignments. For example, a bar in the $33^{rd}$ column of projection barcode 515 may be aligned with the barcode in the $90^{th}$ column of the drawing barcode 525. Further, a bar in the $476^{th}$ column of projection barcode 515 may be aligned with column 388 of the drawing barcode 525. The alignment would thus be {33, 467, 90, 388}. If may be determined that this alignment has the maximum matching value, per techniques discussed elsewhere herein. Thus, the offset value 805 would be 57, as 90−33 is 57. Since the projection barcode 515 has to be scaled to scaled barcode 517, a scale value may be determined. The scale value may be a ratio of the gap between the designated reference columns of the first barcode over the gap between the designated reference columns of the second barcode. The larger value may be placed in the denominator to produce a scaling factor value that is less than one. In this case, the scaling factor would be 0.686=((388−90)/(467−33)). Based on the scaling factor, the projection barcode and/or the drawing barcode may be scaled to correspond in size. Further, based on the scaling factor, the 2D projection image and/or the 2D design image may be scaled to correspond in size with each other.

Using these techniques, proper alignment and scaling of drawings may be determined. In other embodiments, however, an alignment technique that is different from the above-described technique utilizing barcodes may be used. In other words, any alignment technique suitable for aligning two or more images that represent the same or substantially similar object(s) may be used to align the 2D design image 230 and the 2D projection image 220.

Figure 9:
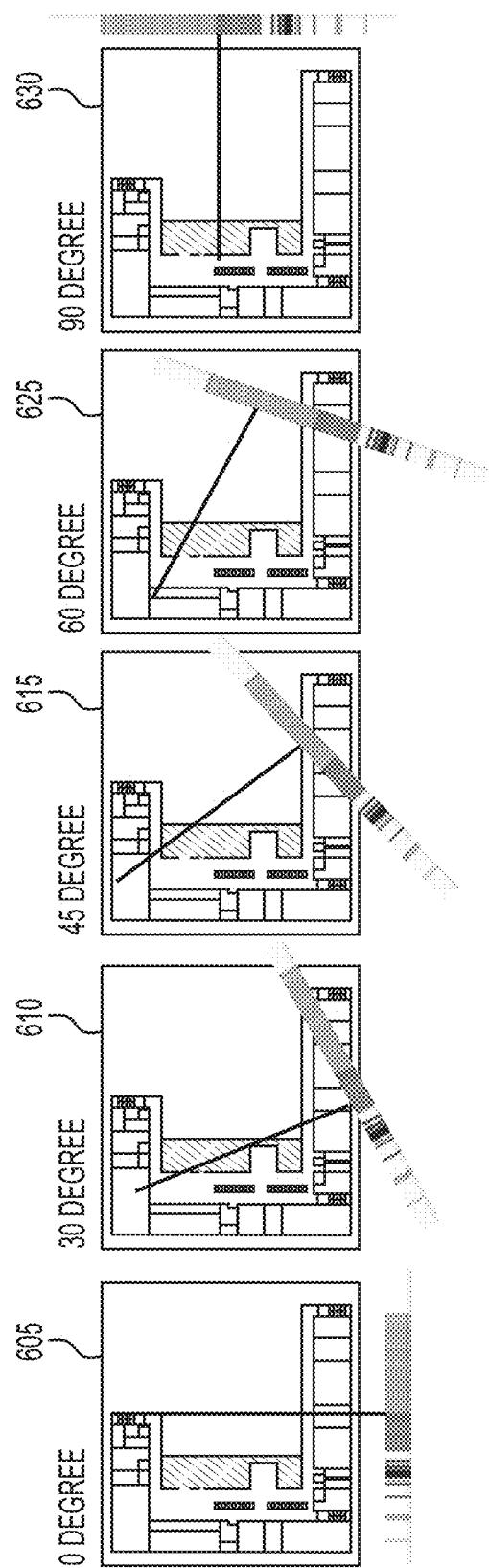
FIG. 9 illustrates a barcode rotation procedure, according to techniques presented herein.

Techniques presented herein may also be used to modify the rotation of a drawing in order to align two similar images. For example, FIG. 9 illustrates a barcode rotation procedure, according to techniques presented herein. While the techniques discussed above generate barcodes based on column pixel information, barcodes may instead be determined based on pixel information taken at a predetermined angle across the image. The drawing at 605 illustrates the column pixel technique discussed above. The barcode at 610, however, illustrates generating the barcode based on pixels aligned at a 30-degree angle across the drawing. The resulting barcode may then be compared to the second barcode, the second barcode being generated using the column technique discussed above, or at least might not be generated from the same 30-degree angle. Barcodes may be generated repeatedly for varying angles when seeking the maximum matching values, such as 45 degrees at 615, 60 degrees at 625, 90 degrees at 630, etc. When the maximum matching value is discovered, the degree of angle from which the barcode was calculated may indicate the amount one of the drawings may need to be rotated in order to achieve alignment between the 2D design image 230 and the 2D projection image 220.

Figure 10:
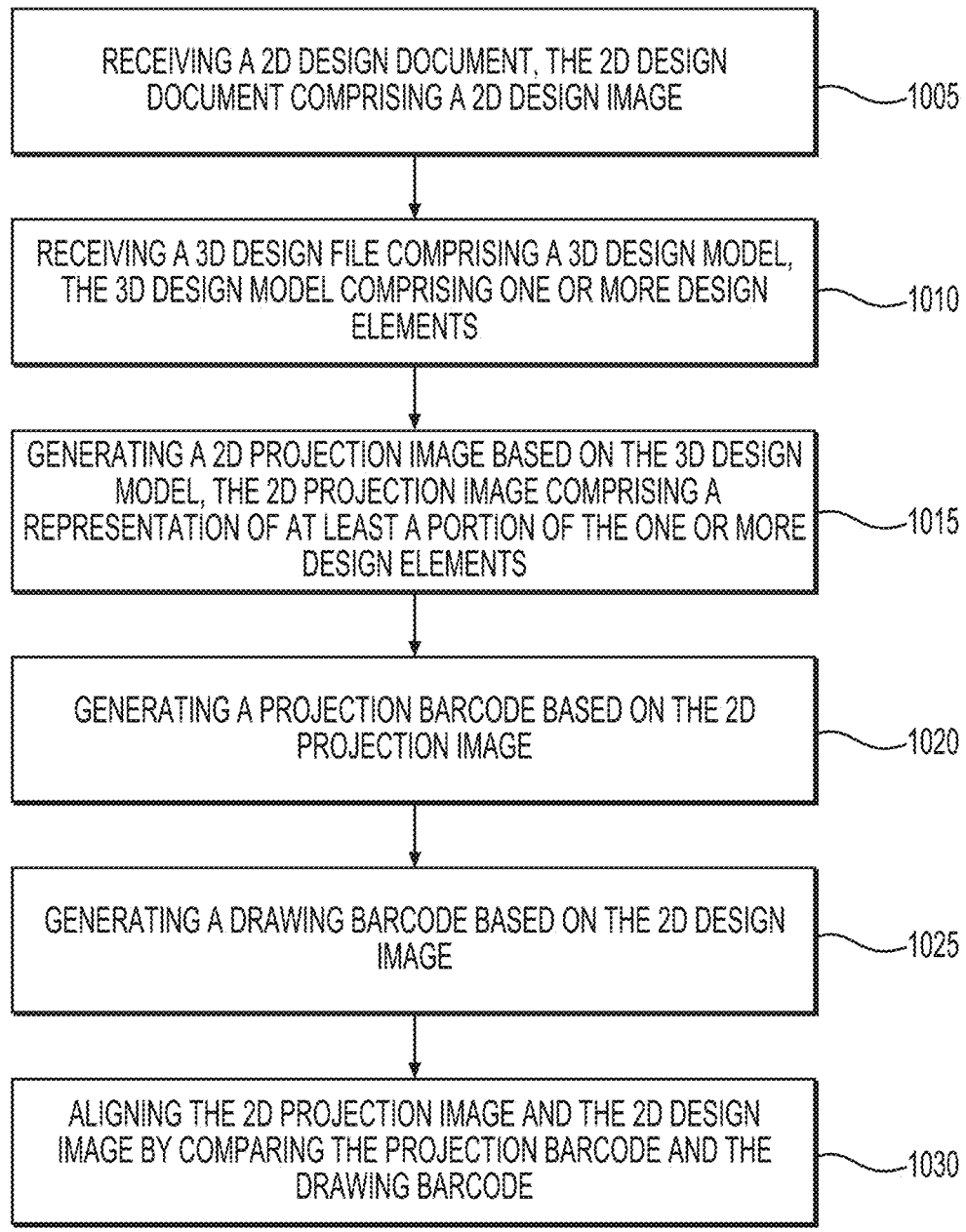
FIG. 10 is a flowchart illustrating an exemplary method of automatically aligning electronic images, according to at least one aspect of the present disclosure.

FIG. 10 is a flowchart illustrating an exemplary method of aligning a two-dimensional (2D) design image to a 2D projection image of a three-dimensional (3D) design model, according to one aspect of the present disclosure. In particular, the method 500 may be performed by the model-to-document linkage component 105 of the document review application 100. At step 1005, a 2D design document may be received, the 2D design document comprising a 2D design image. At step 1010, a 3D design file may be received comprising a 3D design model, the 3D design model comprising one or more design elements. At step 1015, a 2D projection image may be generated based on the 3D design model, the 2D projection image comprising a representation of at least a portion of the one or more design elements. At step 1020, a projection barcode may be generated based on the 2D projection image. At step 1025, a drawing barcode based on the 2D design image may be generated. At step 1030, the 2D projection image and the 2D design image may be aligned by comparing the projection barcode and the drawing barcode.

Unless specifically stated otherwise, as apparent from the following discussions, it is appreciated that throughout the specification discussions utilizing terms such as "processing," "computing," "calculating," "determining", analyzing" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer," a "computing machine," a "computing platform," a "computing device," or a "server" may include one or more processors.

Figure 11:
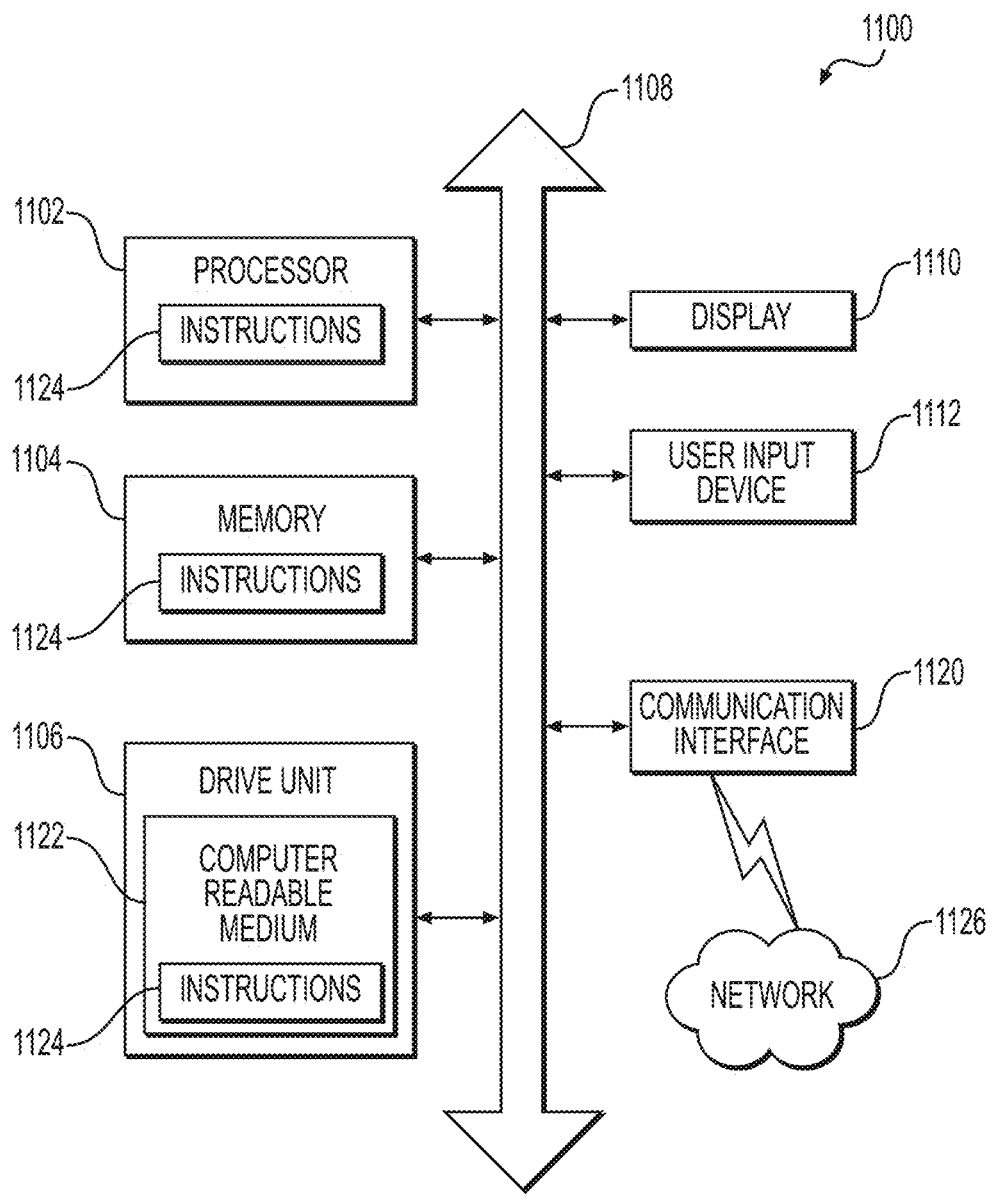
FIG. 11 illustrates an implementation of a computer system that may execute techniques presented herein.

FIG. 11 illustrates an implementation of a computer system that may execute techniques presented herein. The computer system 1100 can include a set of instructions that can be executed to cause the computer system 1100 to perform any one or more of the methods or computer based functions disclosed herein. The computer system 1100 may operate as a standalone device or may be connected, e.g., using a network, to other computer systems or peripheral devices.

In a networked deployment, the computer system 1100 may operate in the capacity of a server or as a client user computer in a server-client user network environment, or as a peer computer system in a peer-to-peer (or distributed) network environment. The computer system 1100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the computer system 1100 can be implemented using electronic devices that provide voice, video, or data communication. Further, while a single computer system 1100 is illustrated, the term "system" shall also be taken to include any collection of systems or sub-systems that individually or jointly execute a set, or multiple sets, of instructions to perform one or more computer functions.

As illustrated in FIG. 11, the computer system 1100 may include a processor 1102, e.g., a central processing unit (CPU), a graphics processing unit (GPU), or both. The processor 1102 may be a component in a variety of systems. For example, the processor 1102 may be part of a standard personal computer or a workstation. The processor 1102 may be one or more general processors, digital signal processors, application specific integrated circuits, field programmable gate arrays, servers, networks, digital circuits, analog circuits, combinations thereof, or other now known or later developed devices for analyzing and processing data. The processor 1102 may implement a software program, such as code generated manually (i.e., programmed).

The computer system 1100 may include a memory 1104 that can communicate via a bus 1108. The memory 1104 may be a main memory, a static memory, or a dynamic memory. The memory 1104 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 1104 includes a cache or random-access memory for the processor 1102. In alternative implementations, the memory 1104 is separate from the processor 1102, such as a cache memory of a processor, the system memory, or other memory. The memory 1104 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 1104 is operable to store instructions executable by the processor 1102. The functions, acts or tasks illustrated in the figures or described herein may be performed by the programmed processor 1102 executing the instructions stored in the memory 1104. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the computer system 1100 may further include a display unit 1110, such as a liquid crystal display (LCD), an organic light emitting diode (OLED), a flat panel display, a solid-state display, a cathode ray tube (CRT), a projector, a printer or other now known or later developed display device for outputting determined information. The display 1110 may act as an interface for the user to see the functioning of the processor 1102, or specifically as an interface with the software stored in the memory 1104 or in the drive unit 1106.

Additionally or alternatively, the computer system 1100 may include an input device 1112 configured to allow a user to interact with any of the components of system 1100. The input device 1112 may be a number pad, a keyboard, or a cursor control device, such as a mouse, or a joystick, touch screen display, remote control, or any other device operative to interact with the computer system 1100.

The computer system 1100 may also or alternatively include a disk or optical drive unit 1106. The disk drive unit 1106 may include a computer-readable medium 1122 in which one or more sets of instructions 1124, e.g. software, can be embedded. Further, the instructions 1124 may embody one or more of the methods or logic as described herein. The instructions 1124 may reside completely or partially within the memory 1104 and/or within the processor 1102 during execution by the computer system 1100. The memory 1104 and the processor 1102 also may include computer-readable media as discussed above.

In some systems, a computer-readable medium 1122 includes instructions 1124 or receives and executes instructions 1124 responsive to a propagated signal so that a device connected to a network 1126 can communicate voice, video, audio, images, or any other data over the network 1126. Further, the instructions 1124 may be transmitted or received over the network 1126 via a communication port or interface 1120, and/or using a bus 1108. The communication port or interface 1120 may be a part of the processor 1102 or may be a separate component. The communication port 1120 may be created in software or may be a physical connection in hardware. The communication port 1120 may be configured to connect with a network 1126, external media, the display 1110, or any other components in system 1100, or combinations thereof. The connection with the network 1126 may be a physical connection, such as a wired Ethernet connection or may be established wirelessly as discussed below. Likewise, the additional connections with other components of the system 1100 may be physical connections or may be established wirelessly. The network 1126 may alternatively be directly connected to the bus 1108.

While the computer-readable medium 1122 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 1122 may be non-transitory, and may be tangible.

The computer-readable medium 1122 can include a solid-state memory such as a memory card or other package that houses one or more non-volatile read-only memories. The computer-readable medium 1122 can be a random-access memory or other volatile re-writable memory. Additionally or alternatively, the computer-readable medium 1122 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The computer system 1100 may be connected to one or more networks 1126. The network 1126 may define one or more networks including wired or wireless networks. The wireless network may be a cellular telephone network, an 802.11, 802.16, 802.20, or WiMax network. Further, such networks may include a public network, such as the Internet, a private network, such as an intranet, or combinations thereof, and may utilize a variety of networking protocols now available or later developed including, but not limited to TCP/IP based networking protocols. The network 1126 may include wide area networks (WAN), such as the Internet, local area networks (LAN), campus area networks, metropolitan area networks, a direct connection such as through a Universal Serial Bus (USB) port, or any other networks that may allow for data communication. The network 1126 may be configured to couple one computing device to another computing device to enable communication of data between the devices. The network 1126 may generally be enabled to employ any form of machine-readable media for communicating information from one device to another. The network 1126 may include communication methods by which information may travel between computing devices. The network 1126 may be divided into sub-networks. The sub-networks may allow access to all of the other components connected thereto or the sub-networks may restrict access between the components. The network 1126 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component/object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the steps of methods discussed are performed in one embodiment by an appropriate processor (or processors) of a processing (i.e., computer) system executing instructions (computer-readable code) stored in storage. It will also be understood that the invention is not limited to any particular implementation or programming technique and that the invention may be implemented using any appropriate techniques for implementing the functionality described herein. The invention is not limited to any particular programming language or operating system.

It should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as falling within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

The above disclosed subject matter is to be considered illustrative, and not restrictive, and the appended claims are intended to cover all such modifications, enhancements, and other implementations, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description. While various implementations of the disclosure have been described, it will be apparent to those of ordinary skill in the art that many more implementations and implementations are possible within the scope of the disclosure. Accordingly, the disclosure is not to be restricted except in light of the attached claims and their equivalents.

What is claimed is:

1. A method of cross-referencing between a three-dimensional (3D) model and a two-dimensional (2D) document, comprising:
receiving the 2D document and the 3D model, the 2D document comprising a first 2D image and the 3D model comprising a plurality of elements;
generating a second 2D image based on the 3D model, the second 2D image comprising a representation of the plurality of elements from the 3D model; and
generating a coded 2D image based on the second 2D image by assigning a coded indicator to each of the plurality of elements represented on the second 2D image, wherein each of the coded indicators displayed on the coded 2D image uniquely identifies a corresponding element of the plurality of elements from the 3D model, wherein the coded indicator includes a color such that the indicator value defines an RGB value that is uniquely assigned to each of the plurality of elements.

2. The method of claim 1, wherein the coded indicator includes an indicator value that defines a unique identifier for each of the plurality of elements in the 3D model.

3. The method of claim 2, further comprising:
generating the unique identifier for each of the plurality of elements in the 3D model; and
storing the unique identifier in the 3D model in association with each corresponding element of the plurality of elements.

4. The method of claim 2, further comprising:
selecting a point on the second 2D image that overlies the representation of a first element of the plurality of elements on the second 2D image; and
mapping the point to a reference point in the coded 2D image to identify the coded indicator corresponding to the first element represented on the second 2D image.

5. The method of claim 4, further comprising:
determining, based on the reference point in the coded 2D image, the indicator value of the coded indicator for the first element represented on the second 2D image.

6. The method of claim 5, further comprising:
matching the indicator value of the coded indicator for the first element to the corresponding element in the 3D model based on the unique identifier, wherein the 3D model stores properties of the plurality of elements.

7. The method of claim 6, further comprising:
retrieving one or more properties of the corresponding element from the 3D model; and
displaying the one or more properties of the first element on the second 2D image.

8. The method of claim 6, wherein the properties of the plurality of elements stored in the 3D model include a shape, a width, a height, a length, a perimeter, a thickness, a cross-sectional area, a material, a cost, or a work schedule associated with each of the plurality of elements.

9. The method of claim 2, further comprising:
selecting a region on the second 2D image that is defined by an enclosed shape, wherein the region overlies the representation of one or more elements of the plurality of elements on the second 2D image; and
mapping the region to a reference region in the coded 2D image to identify the one or more coded indicators corresponding to the one or more elements represented on the second 2D image.

10. The method of claim 9, further comprising:
determining, based on the reference region in the coded 2D image, the one or more indicator values of the one or more coded indicators for the one or more elements represented on the second 2D image; and
matching the one or more indicator values of the one or more coded indicators for the one or more elements to the corresponding one or more elements in the 3D model based on the one or more unique identifiers, wherein the 3D model stores properties of the plurality of elements.

11. The method of claim 10, further comprising:
retrieving one or more properties of the one or more elements from the 3D model; and
displaying the one or more properties of the one or more elements on the second 2D image.

12. The method of claim 1, wherein the coded indicator includes a color, a pattern, a shape, a tag, an alphanumeric character, a tooltip, or a symbol.

13. The method of claim 1, wherein prior to generating the coded 2D image, the method comprises:
generating a first barcode based on the first 2D image and a second barcode based on the second 2D image;
comparing the first barcode to the second barcode; and
aligning the first 2D image and the second 2D image with one another.

14. A system for cross-referencing between a three-dimensional (3D) model and a two-dimensional (2D) document, the system comprising:
one or more processors; and
one or more storage devices storing instructions that, when executed by the one or more processors, cause the one or more processors to perform a method comprising:
receiving the 2D document and the 3D model, the 2D document comprising a first 2D image and the 3D model comprising a plurality of elements;
generating a second 2D image based on the 3D model, the second 2D image comprising a representation of the plurality of elements from the 3D model; and
generating a coded 2D image based on the second 2D image by assigning a coded indicator to each of the plurality of elements represented on the second 2D image, wherein each of the coded indicators displayed on the coded 2D image uniquely identifies a corresponding element of the plurality of elements from the 3D model, wherein the coded indicator includes a color such that the indicator value defines an RGB value that is uniquely assigned to each of the plurality of elements.

15. The system of claim 14, wherein the method further comprises:
generating a unique identifier for each of the plurality of elements in the 3D model and storing the unique identifier in the 3D model in association with each corresponding element of the plurality of elements.

16. The system of claim 15, wherein the method further comprises:
mapping, in response to receiving a point selection on the second 2D image that overlies the representation of a first element of the plurality of elements on the second 2D image, the point selection to a reference point in the coded 2D image; and
determining, based on the reference point in the coded 2D image, the indicator value of the coded indicator for the first element represented on the second 2D image.

17. The system of claim 16, wherein the method further comprises:
matching the indicator value of the coded indicator for the first element to the corresponding element in the 3D model based on the unique identifier, wherein the 3D model stores properties of the plurality of elements;
retrieving the properties of the element from the 3D model; and
displaying the properties of the first element on the second 2D image.

18. The system of claim 14, wherein the coded indicator includes an indicator value that defines a unique identifier for each of the plurality of elements in the 3D model; and
wherein the coded indicator includes a color such that the indicator value defines an RGB value that is uniquely assigned to each of the plurality of elements.

19. A non-transitory computer readable medium for cross-referencing between a three-dimensional (3D) model and a two-dimensional (2D) document, the non-transitory computer readable medium storing instructions that, when executed by one or more processors, cause the one or more processors to perform a method comprising:
receiving the 2D document and the 3D model, the 2D document comprising a first 2D image and the 3D model comprising a plurality of elements;
generating a second 2D image based on the 3D model, the second 2D image comprising a representation of the plurality of elements from the 3D model; and
generating a coded 2D image based on the second 2D image by assigning a coded indicator to each of the plurality of elements represented on the second 2D image, wherein each of the coded indicators displayed on the coded 2D image uniquely identifies a corresponding element of the plurality of elements from the 3D model, wherein the coded indicator includes a color such that the indicator value defines an RGB value that is uniquely assigned to each of the plurality of elements.

* * * * *